(12) United States Patent
Yeh

(10) Patent No.: US 6,975,156 B2
(45) Date of Patent: Dec. 13, 2005

(54) SWITCHED CAPACITOR CIRCUIT CAPABLE OF MINIMIZING CLOCK FEEDTHROUGH EFFECT IN A VOLTAGE CONTROLLED OSCILLATOR CIRCUIT AND METHOD THEREOF

(75) Inventor: En-Hsiang Yeh, Hsin-Chu (TW)

(73) Assignee: MediaTek Inc., Hsin-Chu Hsien (TW)

( * ) Notice: Subject to any disclaimer, the term of this patent is extended or adjusted under 35 U.S.C. 154(b) by 0 days.

(21) Appl. No.: 10/605,428

(22) Filed: Sep. 30, 2003

(65) Prior Publication Data

US 2005/0068084 A1     Mar. 31, 2005

(51) Int. Cl.[7] ................................... G06F 7/64
(52) U.S. Cl. .................... 327/337; 331/36 C
(58) Field of Search ................. 327/337, 403, 327/404; 331/8, 16–17, 34, 36 C

(56) References Cited

U.S. PATENT DOCUMENTS

| | | | |
|---|---|---|---|
| 5,656,975 A | 8/1997 | Imura | |
| 6,121,831 A * | 9/2000 | Mack | 330/9 |
| 6,226,506 B1 | 5/2001 | Welland et al. | |
| 6,393,070 B1 * | 5/2002 | Reber | 375/340 |
| 6,577,135 B1 * | 6/2003 | Matthews et al. | 324/426 |
| 6,628,164 B2 * | 9/2003 | Ramesh et al. | 330/9 |

* cited by examiner

*Primary Examiner*—My-Trang Nu Ton
*Assistant Examiner*—Cassandra Cox
(74) *Attorney, Agent, or Firm*—Winston Hsu

(57) ABSTRACT

A first switch element selectively connects a first node being connected to a capacitor to a second node according to a first control signal. A precharge circuit is connected to the first node for precharging the first node to a precharge voltage for a predetermined time period when the switched capacitor circuit is switched off. The precharge circuit includes a second switch element for selectively connecting a third node to the first node according to a second control signal; a precharge switch element for selectively connecting the precharge voltage to the third node according to the first control signal; and a delay unit for delaying the first control signal to generate the second control signal. In this way, the clock feedthrough effect is minimized and the capacitance of a varactor formed by the first switch element in the off-state is stabilized during the VCO locking period.

28 Claims, 13 Drawing Sheets

SWITCHED CAPACITOR CIRCUIT CAPABLE OF MINIMIZING CLOCK FEEDTHROUGH EFFECT IN A VOLTAGE CONTROLLED OSCILLATOR CIRCUIT AND METHOD THEREOF

BACKGROUND OF INVENTION

1. Field of the Invention

The present invention relates to a switched capacitor circuit, and more particularly, to a switched capacitor circuit used in a voltage controlled oscillator (VCO) that can minimize the clock feedthrough effect thereby preventing a VCO frequency drift phenomenon during the calibration and the synthesizer phase locking periods.

2. Description of the Prior Art

A voltage controlled oscillator (VCO) is commonly used for frequency synthesis in wireless communication circuits. As Welland, et al. state in U.S. Pat. No. 6,226,506, wireless communication systems typically require frequency synthesis in both the receive path circuitry and the transmit path circuitry.

FIG. 1 shows a VCO circuit according to the prior art. An LC type VCO 10 used in a frequency synthesizer contains a resonator, and the basic resonant structure includes an inductor 12 connected between a first oscillator node OSC_P and a second oscillator node OSC_N. Connected in parallel with the inductor 12 is a continuously variable capacitor 14 and a plurality of discretely variable capacitors 16. The continuously variable capacitor 14 is used for fine-tuning a desired capacitance while the plurality of discretely variable capacitors 16 is used for coarse tuning. The resistive loss of the parallel combination of inductor and capacitors is compensated by a negative resistance generator 18 to sustain the oscillation.

Each discretely variable capacitor in the plurality of discretely variable capacitors 16 is made up of a switched capacitor circuit 20 and each switched capacitor circuit is controlled by an independent control signal (SW_1 to SW_N). Based on the control signal SW_N the switched capacitor circuit 20 can selectively connect or disconnect a capacitor 24 to the resonator of the VCO 10. Different on/off combinations of switched capacitor arrays results in a wider capacitance range of the LC type resonator and hence a wider VCO 10 oscillation frequency coverage.

FIG. 2 shows a switched capacitor circuit 20a according to the prior art. A capacitor 30 is connected between the first oscillator node OSC_P and a node A. A switch element 32 selectively connects node A to ground, and the switch element 32 is controlled by a control signal SW. When the switch element 32 is turned on, the capacitance associated with the capacitor 30 is added to the overall capacitance in the VCO 10 resonator. When the switch element 32 is turned off, the capacitance looking into the first oscillator node OSC_P is the series combination of the capacitor 30 and the off state capacitance associated with the switch element 32.

FIG. 3 shows a differential type switched capacitor circuit 20b according to the prior art. Differential implementations have much greater common-mode noise rejection and are widely used in high-speed integrated circuit environments. In the differential switched capacitor circuit 20b, a positive side capacitor 40 is connected between the first oscillator node OSC_P and a node A. A positive side switch element 42 selectively connects node A to ground. A negative side capacitor 44 is connected between the second oscillator node OSC_N and a node B. A negative side switch element 46 selectively connects node B to ground. The two switch elements 42, 46 are controlled by the same control signal SW. When the switch elements 42, 46 are turned on, the capacitance associated with the series combination of the positive and negative side capacitors 40, 44 is added to the overall capacitance in the VCO 10. When the switch elements 42, 46 are turned off, the differential input capacitance is the series combination of the positive and negative side capacitors 40, 44 and other switch parasitic capacitance. The overall input capacitance when all switch elements 42, 46 are turned off is lower than that when all switch elements 42, 46 are turned on.

FIG. 4 shows a second differential type switched capacitor circuit 20c according to the prior art. The second differential switched capacitor circuit 20c is comprised of the same components as the first differential switched capacitor circuit 20c and there is also a center switch element 48 used to lower the overall turn-on switch resistance connected between node A and node B. All three switch elements 42, 46, 48 are controlled by the same control signal SW. When the switch elements 42, 46, 48 are turned on, the capacitance associated with the series combination of the positive and negative side capacitors 40, 44 is added to the overall capacitance in the VCO 10. When the switch elements 42, 46, 48 are turned off, the differential input capacitance is the series combination of the positive and negative side capacitors 40, 44 and other switch parasitic capacitance. The overall input capacitance when all switch elements 42, 46, 48 are turned off is lower than that when all switch elements 42, 46, 48 are turned on.

Regardless of whether the single ended implementation shown in FIG. 2 or one of the differential implementations shown in FIG. 3 and FIG. 4 is used, when the switched capacitor circuit 20a, 20b, 20c is turned off, a momentary voltage step change occurs at node A (and in the case of the differential implementations also at node B). The momentary voltage step causes an undesired change in the overall capacitance, and ultimately, an undesired change in the VCO 10 frequency. Because NMOS switches are used in the examples shown in FIG. 2, FIG. 3, and FIG. 4, the momentary voltage step change is a voltage drop when the switch elements 32, 42, 46, 48 are turned off.

Using the single ended case shown in FIG. 2 as an example, when the switch element 32 is turned off, charge carriers are injected to the junction capacitance connected between the first terminal and the second terminal of the switch element 32. The injection produces an undesired voltage step change across the capacitive impedance and appears as a voltage drop at node A. This effect is known as clock feedthrough effect and appears as a feedthrough of the control signal SW from the control terminal of the switch element 32 to the first and second terminals of the switch element 32. When the switch element 32 is turned on, node A is connected to ground so the feedthrough of the control signal SW is of no consequence. However, when the switch element 32 is turned off, the feedthrough of the control signal SW causes a voltage step, in the form a voltage drop to appear at node A. Because of the dropped voltage at node A, the diode formed by the $N^+$ diffusion of switch element 32 and the P type substrate in the off state will be slightly forward biased. The voltage level at node A will spike low and then recover to ground potential as the slightly forward biased junction diode formed by the switch element 32 in the off state allows subthreshold and leakage currents to flow. The voltage drop and recovery at node A changes the loaded capacitance of the VCO 10 resonator and causes an undesired momentarily drift in the VCO 10 frequency.

When the differential switched capacitor circuit 20c shown in FIG. 4 switches off, it suffers from the same clock feedthrough problem at node A and at node B. The positive side node A has an undesired voltage step change caused by the clock feedthrough effect of both the positive side switch element 42 and the clock feedthrough effect of the center switch element 48. Similarly, the negative side node B has an undesired voltage step change caused by the clock feedthrough effect of both the negative side switch element 46 and the clock feedthrough effect of the center switch element 48. The voltage step change and recovery at node A and node B changes the loaded capacitance of the VCO 10 resonator and causes an undesired momentary drift in the VCO 10 frequency.

SUMMARY OF INVENTION

It is therefore a primary objective of the claimed invention to provide a switched capacitor circuit capable of minimizing the clock feedthrough effect to solve the abovementioned problem of an undesired momentary drift in the voltage controlled oscillator frequency.

According to the claimed invention a switched capacitor circuit is disclosed comprising a first positive side switch element for selectively connecting a first positive side node to a second node according to a first control signal. The first positive side node is connected to a positive side capacitor. A precharge circuit is connected to the first positive side node for precharging the first positive side node to a precharge voltage for a predetermined time when the switched capacitor circuit is switched off.

Also according to the claimed invention, a method is disclosed for switching off a switched capacitor circuit. The method comprises the following steps: (a) Disconnecting a first positive side node from a second node according to a first control signal using a first positive side switch element. (b) Precharging the first positive side node to a precharge voltage for a predetermined time when the switched capacitor circuit is switched off.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
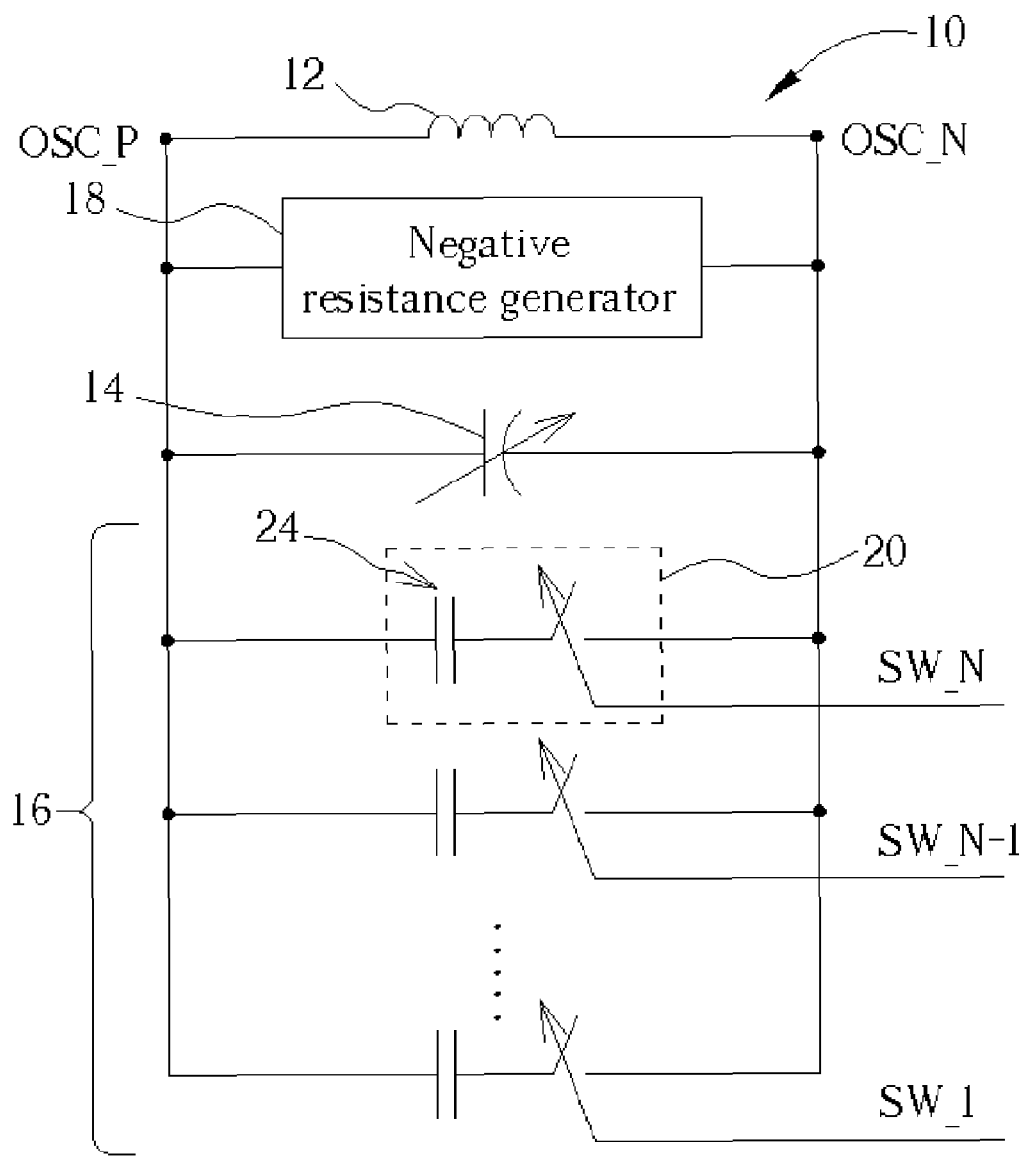
FIG. 1 is a schematic diagram of a typical Voltage Controlled Oscillator (VCO) circuit used in a frequency synthesizer according to the prior art.
Figure 2:
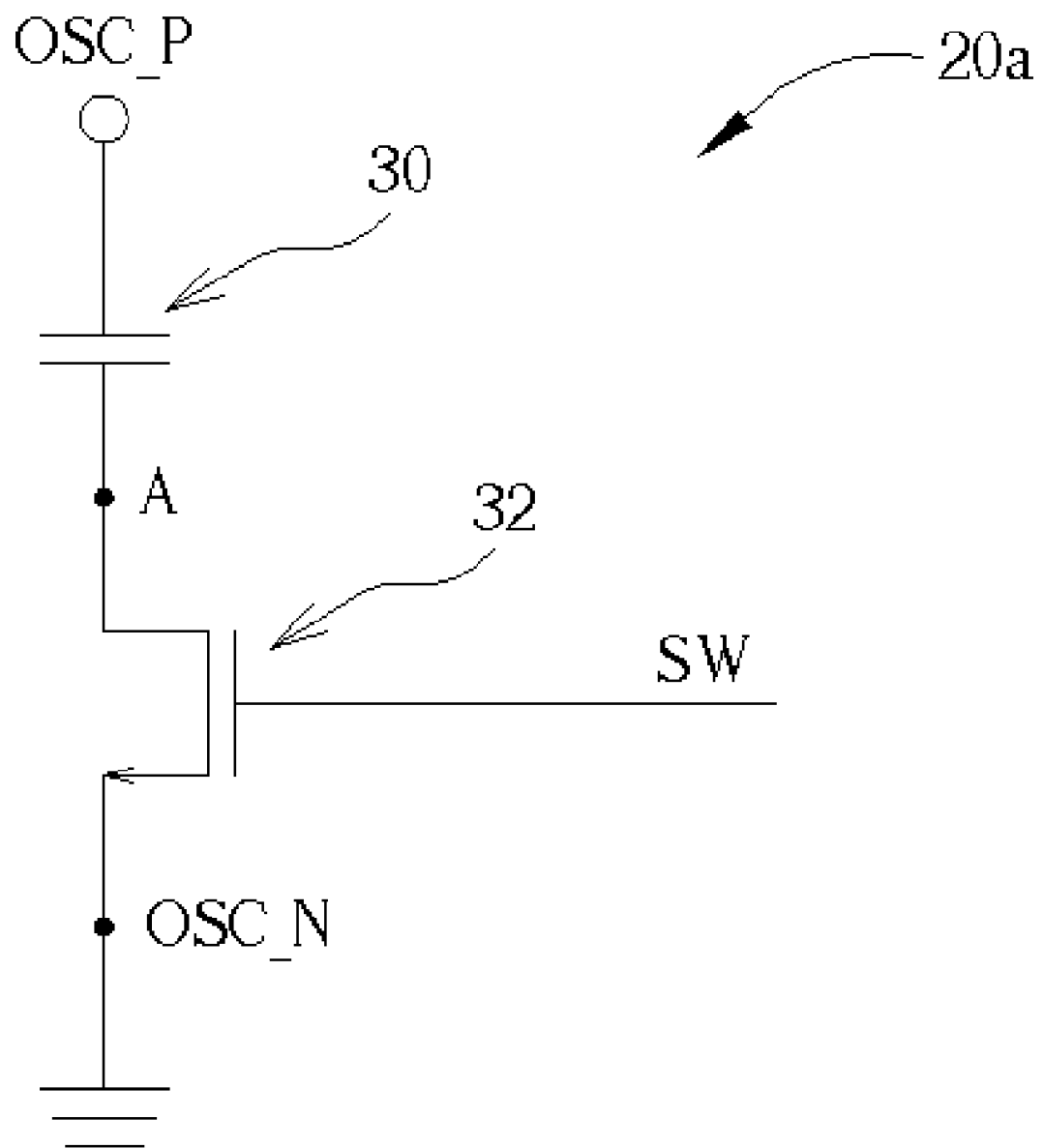
FIG. 2 is a switched capacitor circuit used in the VCO of FIG. 1 according to the prior art.
Figure 3:
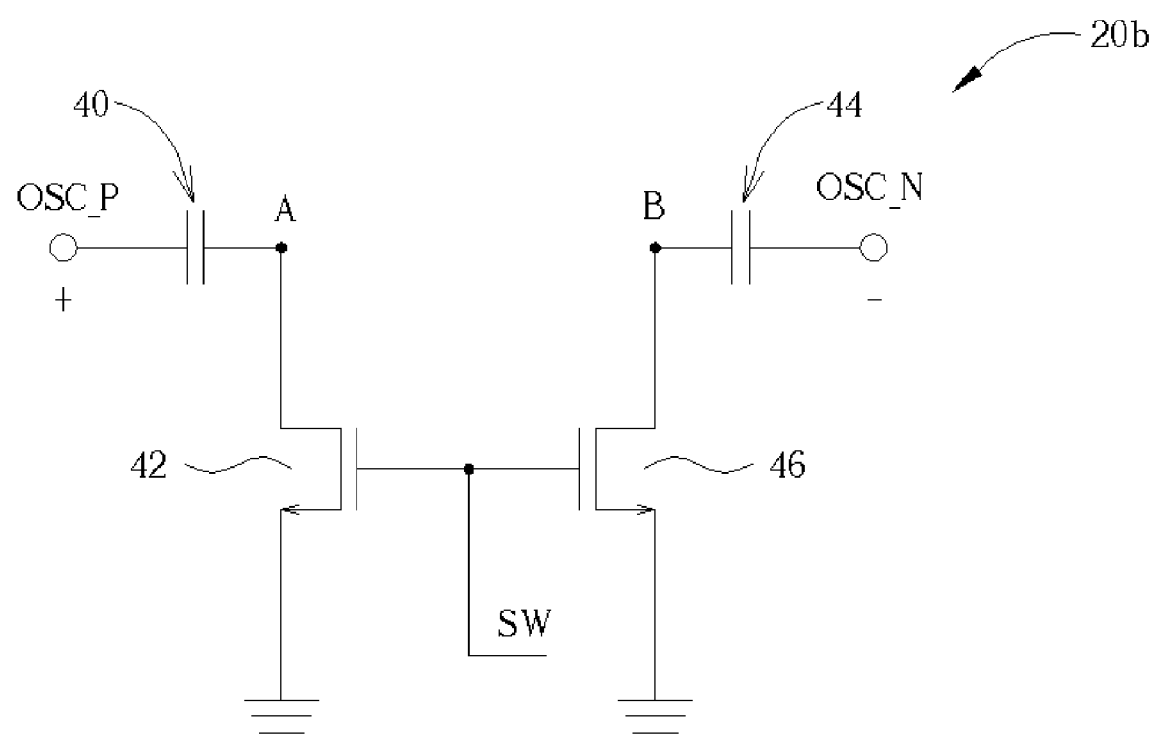
FIG. 3 is a differential type switched capacitor circuit used in the VCO of FIG. 1 according to the prior art.
Figure 4:
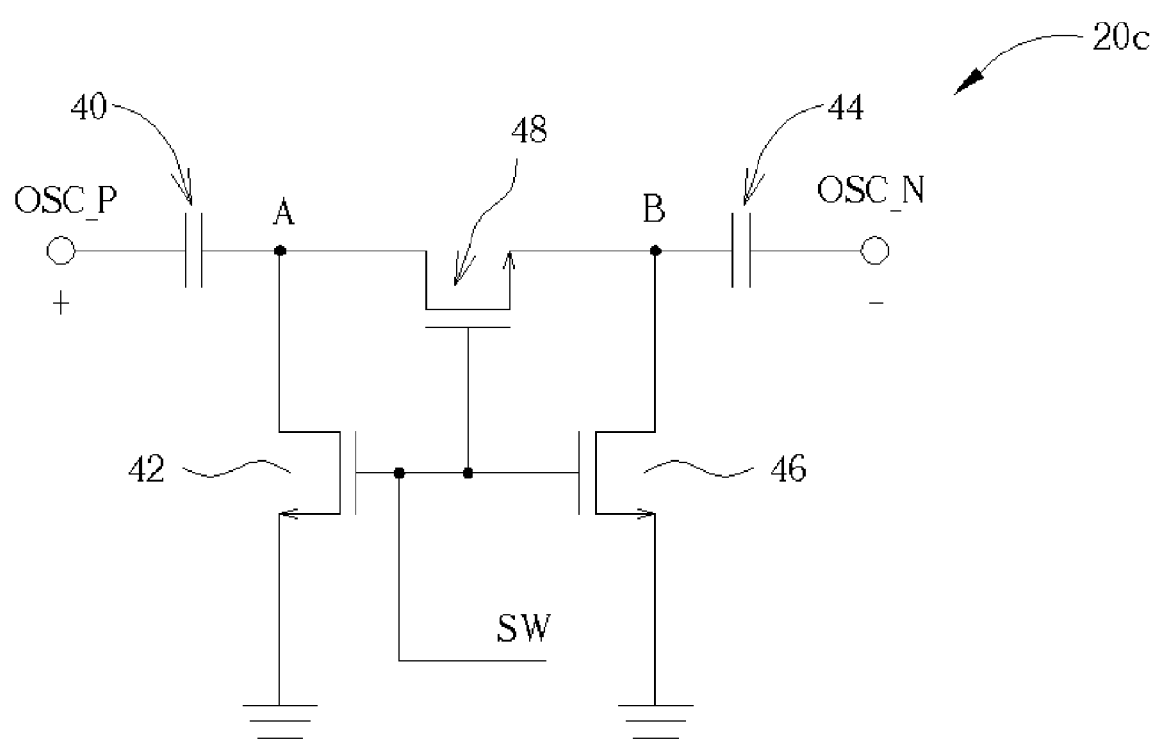
FIG. 4 is the differential type switched capacitor circuit of FIG. 3 with the addition of a center switch element.
Figure 5:
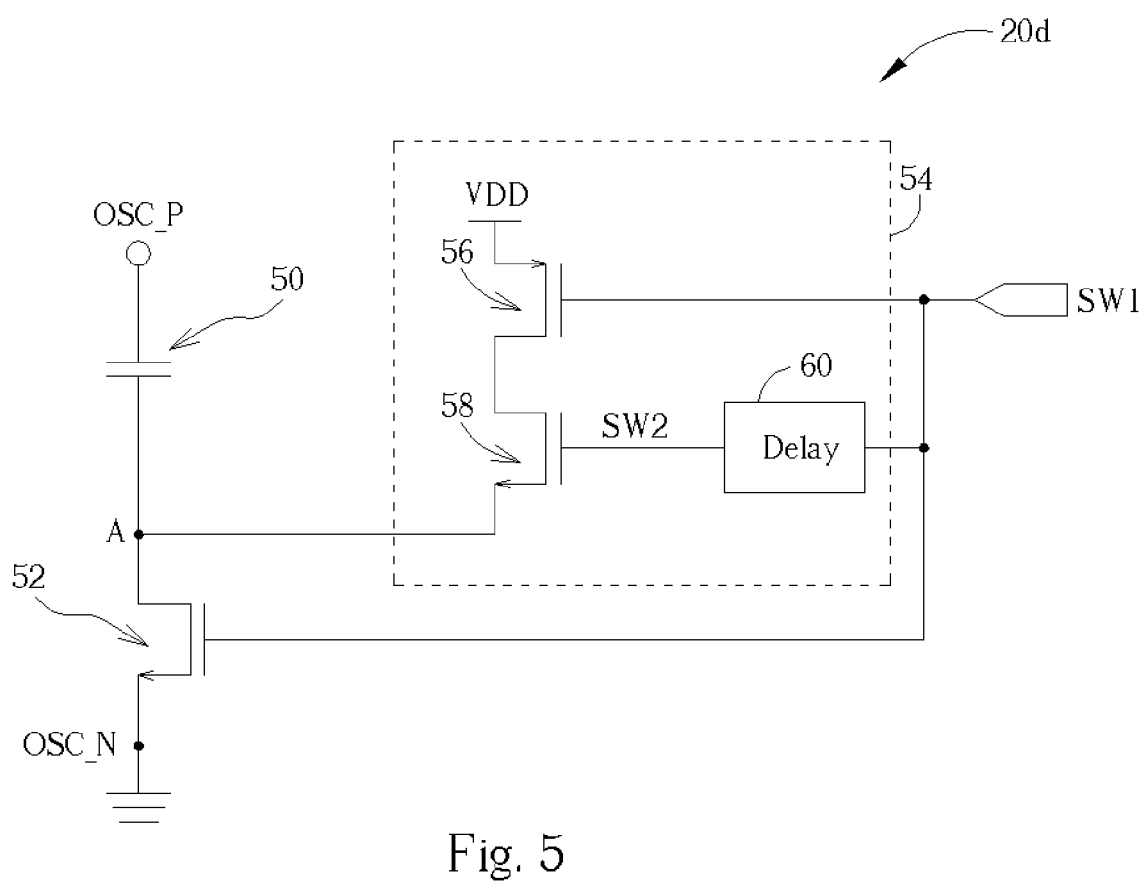
FIG. 5 is a switched capacitor circuit according to the first embodiment of the present invention.

FIG. 5 shows a switched capacitor circuit 20d according to the first embodiment of the present invention. In FIG. 5, the switched capacitor circuit 20d comprises a capacitor 50, a first switch element 52, and a precharge circuit 54. The precharge circuit 54 includes a precharge switch element 56, a second switch element 58, and a delay unit 60. The capacitor 50 is connected between the first oscillator node OSC_P and a node A. The first switch element 52 selectively connects node A to the second oscillator node OSC_N, which is connected to ground, according to a first control signal SW1. The precharge circuit is connected to node A for precharging node A to a precharge voltage for a predetermined time when the switched capacitor circuit 20d is switched off according to the first control signal SW1. When the switched capacitor circuit 20d is switched off, the first control signal SW1 drops to a logic low value. The precharge circuit 54 temporarily connects node A to a precharge voltage, charging node A and preventing the momentary voltage step at node A caused by clock feedthrough. Additionally, a parasitic capacitance associated with the parasitic diode formed by the first switch element 52 in the off position is stabilized.

Figure 6:
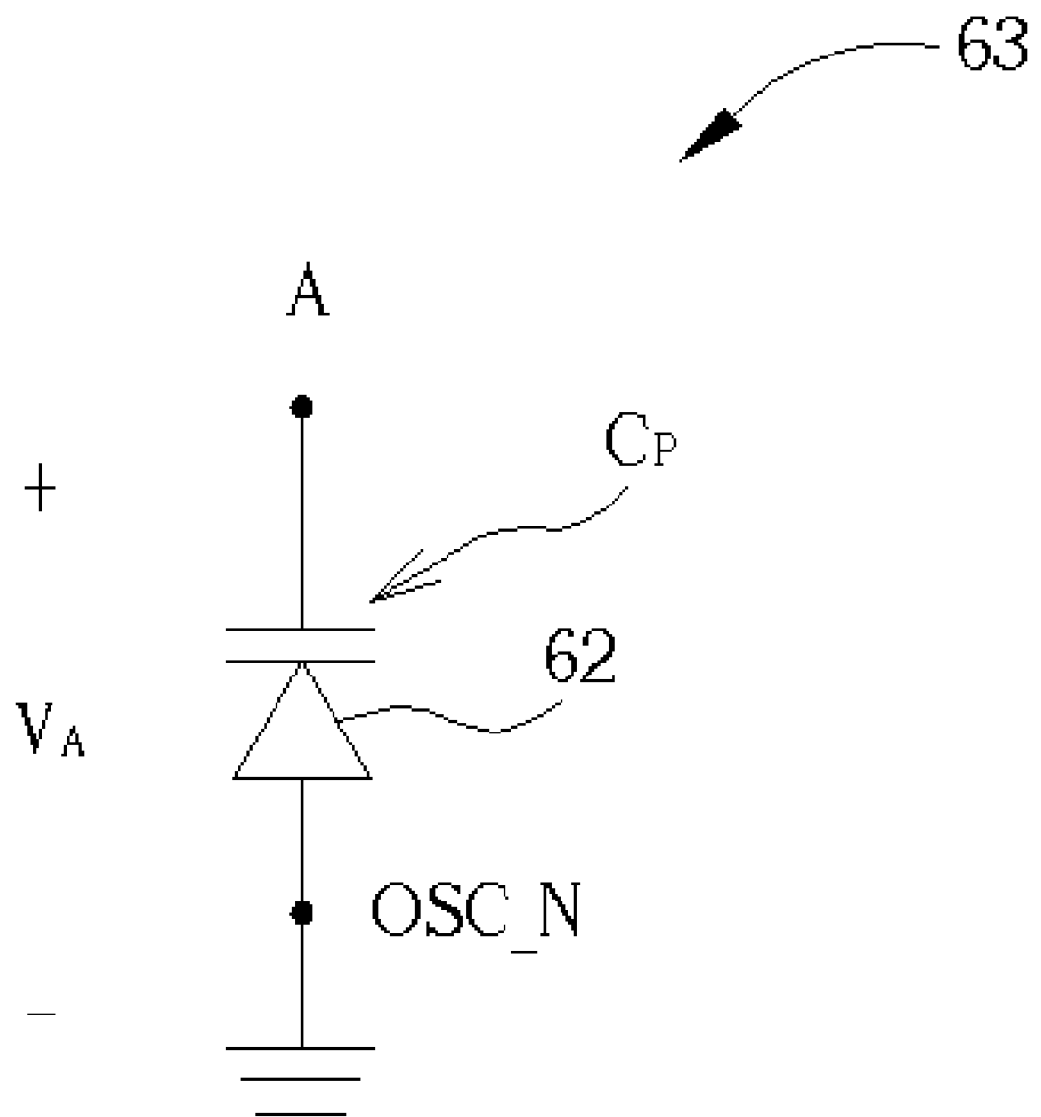
FIG. 6 is the parasitic diode formed by the switch element in FIG. 5 in the off position.

FIG. 6 shows the parasitic diode 62 formed by the switch element 52 in the off position in FIG. 5. The parasitic diode 62 acts as a varactor 63 connected between node A and the second oscillator node OSC_N. The varactor 63 has a parasitic capacitance of Cp determined by the voltage $V_A$ at node A in FIG. 5.

Figure 7:
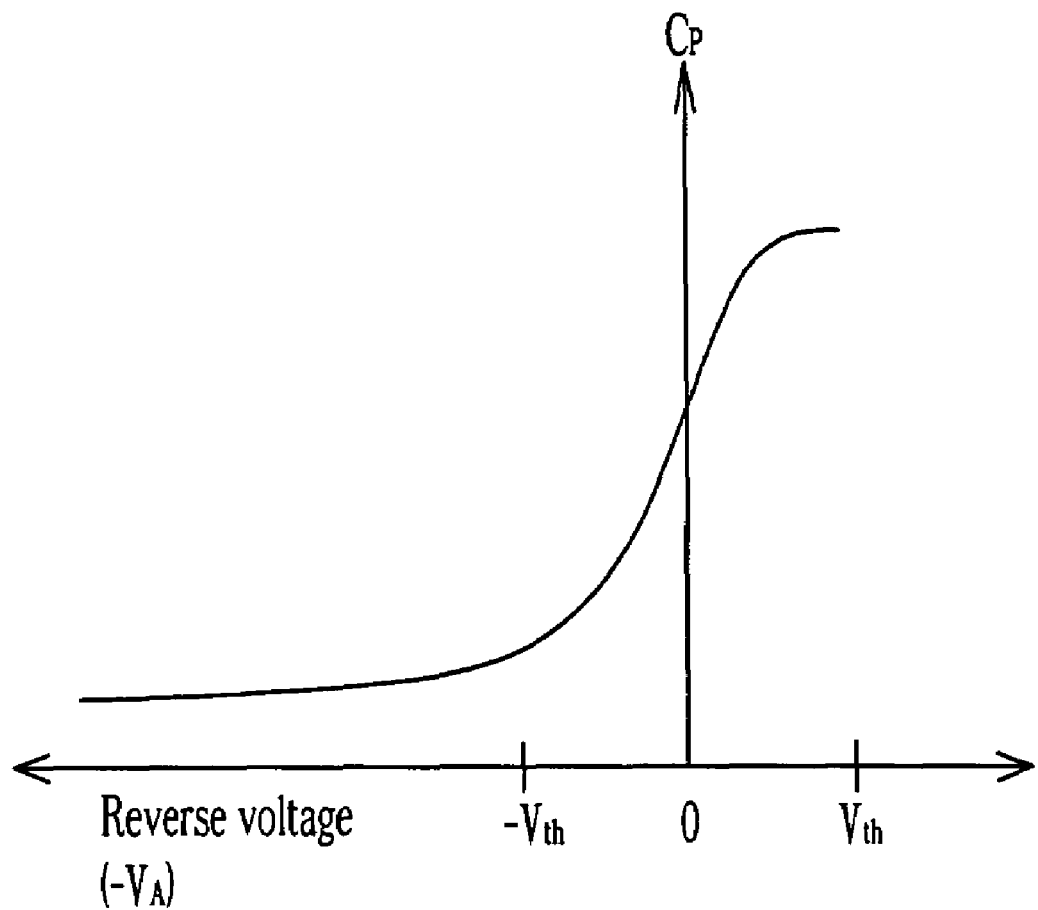
FIG. 7 is a capacitance vs. reverse voltage diagram of the parasitic diode shown in FIG. 6.

FIG. 7 shows a capacitance vs. reverse voltage diagram of the varactor 63 shown in FIG. 6. As the reverse voltage $(-V_A)$ across the varactor 63 changes, the associated parasitic capacitance Cp changes. However, this change is not linear. Reverse voltages within the threshold voltage $V_{th}$ of the first switch element 52 have the greatest parasitic capacitance Cp changes. The present invention uses this fact to precharge node A to a voltage much larger than the threshold voltage of the switch element 52 (VDD for example). This means that as the charge on node A leaks to ground through the first switch element 32, the parasitic capacitance remains approximately the same because. In this way, the locking period of the VCO is shortened and the present invention allows the frequency synthesizer to reach a stable state faster than the prior art implementations.

Figure 8:
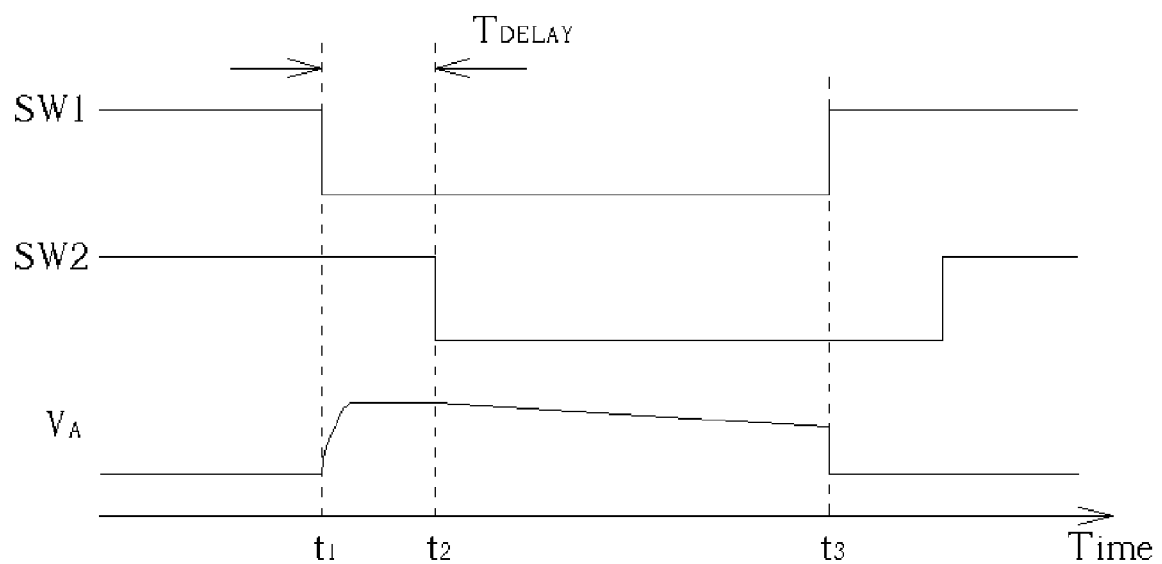
FIG. 8 is a time domain plot of the first control signal, the second control signal, and the voltage at node A in FIG. 5.

FIG. 8 shows a time domain plot of the first control signal SW1, the second control signal SW2, and the voltage at node A in FIG. 5. To switch the switched capacitor circuit 20d to an off state, at time t1 the first control signal SW1 drops to a logic low. This causes the first switch element 52 to switch off, disconnecting node A from ground. At the same time, the precharge switch element 56 is turned on, connecting node A to the power supply node VDD through the second switch element 58. The voltage $V_A$ at node A ramps up toward the precharge voltage, which in this embodiment is VDD. The delay unit 60 delays the first control signal SW1 by a predetermined delay period TDELAY to create the second control signal SW2, which shuts off the second switch element 58 after the predetermined delay period TDELAY. When the second switch element 58 shuts off, node A is disconnected from the precharge voltage VDD. There will be a gradual drop in the voltage $V_A$ at node A after t2 due to leakage currents through the first switch element 52 to ground, however, as the varactor 63 formed by the parasitic diode 62 of the first switch element 32 in the off state is predominately affected by reverse voltages close to the threshold voltage, there will be only a slight capacitance Cp difference. At time t3, the switched capacitor circuit 20d is turned back on by the first control signal SW1 returning to a logic high level. The precharge switch element 56 is turned off and the first switch element 52 is turned on, reconnecting node A to ground.

The positive side capacitor 70 is connected between the first oscillator node OSC_P and a node A, and the negative side capacitor 72 is connected between the second oscillator node OSC_N and a node B. The first positive side switch element 74 selectively connects node A to ground according to a first control signal SW1. The first negative side switch element 76 selectively connects node B to ground according to the first control signal SW1. The center switch element 92 selectively connects node A to node B according to the first control signal SW1. The precharge circuit 78 is connected to node A and node B for precharging nodes A and B to a precharge voltage (in this embodiment VDD) for a predetermined time period when the switched capacitor circuit 20e is switched off according to the first control signal SW1. As in the singled ended circuit shown in FIG. 5, when the differential switched capacitor circuit 20e is switched off, the first control signal SW1 drops to a logic low value. The precharge circuit 78 temporarily connects node A and node B to the precharge voltage VDD, charging nodes A and B and preventing the momentary voltage step at nodes A and B caused by the clock feedthrough effect. Additionally, the parasitic capacitance Cp associated with the varactors 63 formed by the first positive side switch element 74 and the first negative side switch element 76 in the off position is stabilized.

Figure 9:
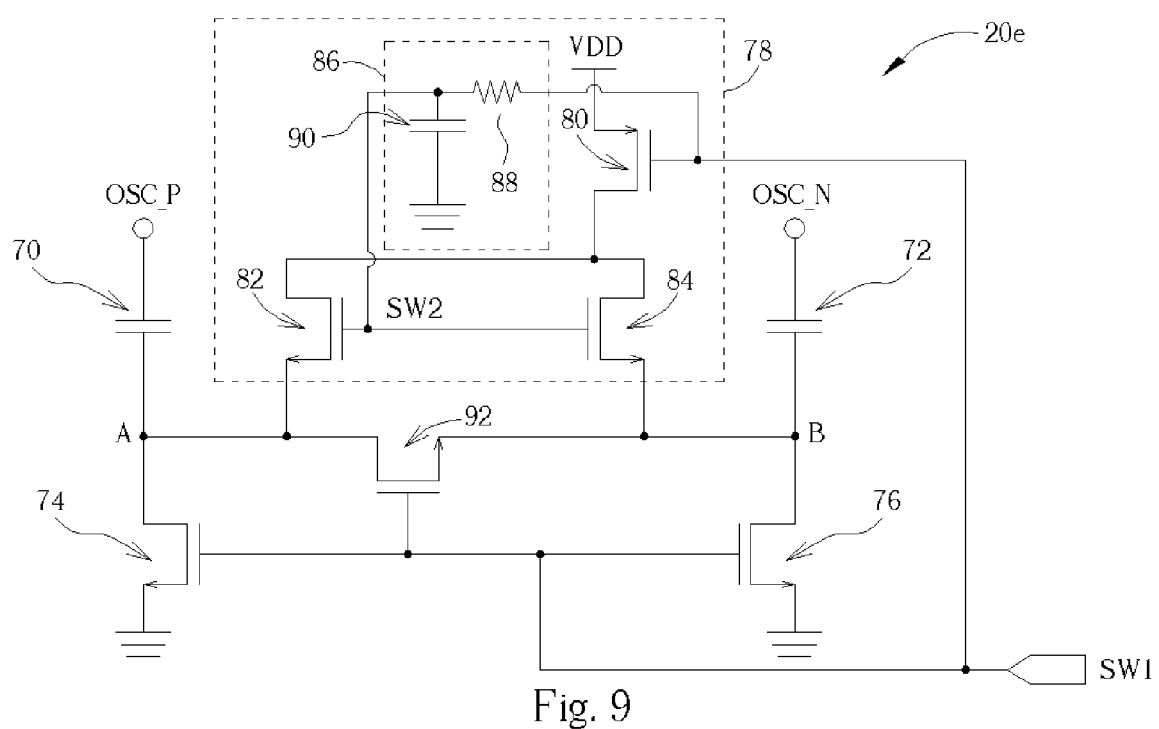
FIG. 9 is a differential switched capacitor circuit according to the second embodiment of the present invention.
Figure 10:
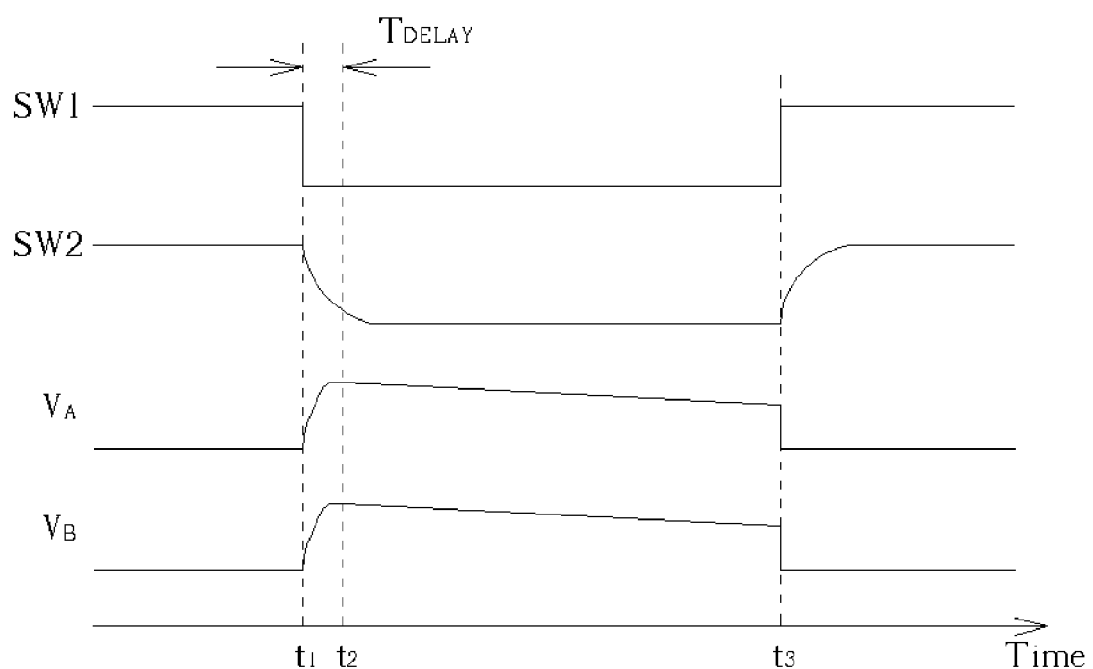
FIG. 10 is a time domain plot of the first control signal, the second control signal, the voltage at node A, and the voltage at node B of FIG. 9.

FIG. 10 shows a time domain plot of the first control signal SW1, the second control signal SW2, the voltage $V_A$ at node A, and the voltage $V_B$ at node B in FIG. 9. To switch the switched capacitor circuit 20e to an off state, at time t1 the first control signal SW1 drops to a logic low. This causes the first positive side switch element 74 and the first negative side switch element 76 to switch off, disconnecting from ground node A and node B respectively. At the same time, the precharge switch element 80 is turned on, connecting node A and node B to a precharge voltage, which is a power supply voltage VDD. The voltages at node $V_A$ and node B $V_B$ ramp up toward VDD as the parasitic capacitance of the varactors formed by the first positive and negative side switch elements 74, 76 are charged by the precharge circuit 78. The delay unit 86 lowpass filters the first control signal SW1 to create the second control signal SW2, which shuts off the second switch element 58 after a predetermined delay period TDELAY. The predetermined delay period TDELAY is defined by how long the second control signal SW2 takes to cross a threshold line causing the second positive and negative switch elements to shut off. When the second positive and negative side switch elements 74, 76 shut off, node A and node B are disconnected from the precharge voltage VDD. There will be a gradual drop in the voltage $VA_A$ at node A and in the voltage $V_B$ at node B due to leakage currents to ground through the first positive and negative side switch elements 74, 76. However, as the varactors 63 formed by the parasitic diode 62 of the first positive side switch element 74 and the first negative side switch element 76 in the off state are predominately affected by reverse voltages close to the threshold voltage, there will be only a slight capacitance Cp difference. At time t3, the switched capacitor circuit 20e is turned back on by the first control signal Sw1 returning to a logic high level. The precharge switch element 80 is turned off and the first positive and negative side switch elements 74, 76 are turned on, reconnecting nodes A and B to ground.

Figure 11:
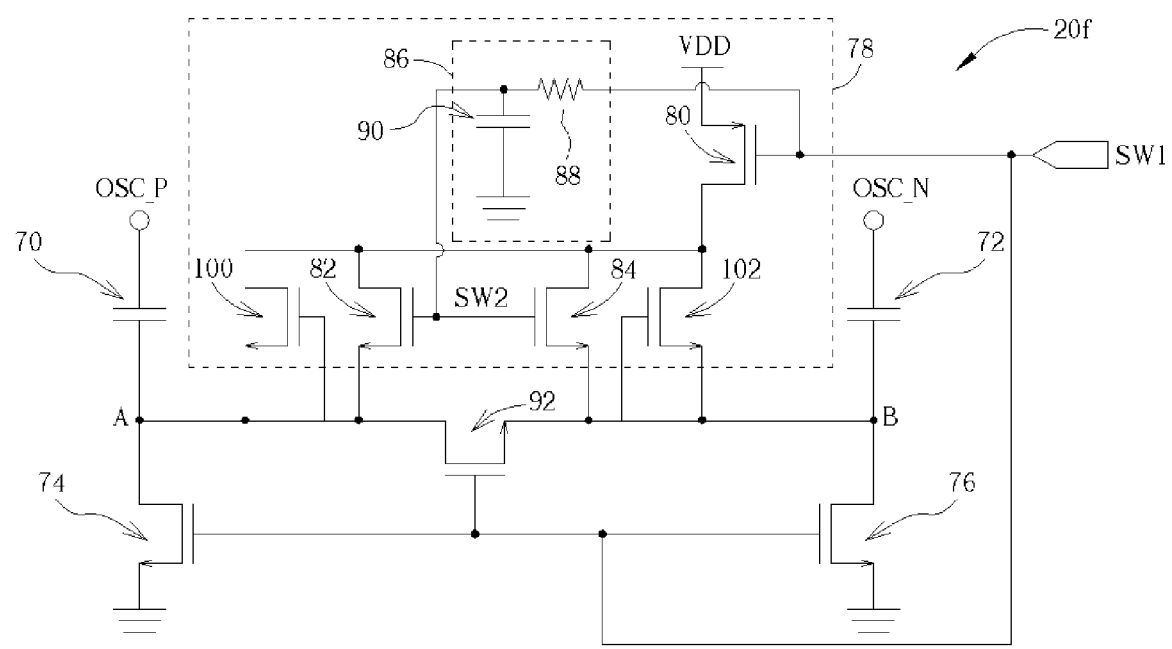
FIG. 11 is a differential switched capacitor circuit according to the third embodiment of the present invention.

FIG. 11 shows a differential switched capacitor circuit according to the third embodiment of the present invention. The third embodiment differential switched capacitor circuit 20f comprises the same basic components as the second embodiment shown in FIG. 9. However, in the third embodiment, the precharge circuit 78 further comprises a third positive side switch element 100 and a third negative side switch element 102. In time division multiple access (TDMA) based radio systems, the actual transmission time for each time-slot is limited to a TDMA time period typically around 400 us. Because of this short TDMA time period, the gradual leakage of the charge at node A and node B is not a concern. The varactors 63 formed by the first positive and negative side switch elements are always reverse biased with a large voltage, and therefore there is very little difference in the parasitic capacitance Cp of the varactors 63 over the TDMA time period. However, in code division multiple access (CDMA) based radio systems, the VCO needs to continuously function. In this situation, the gradual leakage of the voltage at node A and node B needs to be prevented. In the third embodiment of the present invention, the third positive and negative side switch elements 100, 102 prevent this gradual leakage of charge from nodes A and B.

The third positive side switch element 100 is connected in parallel with the second positive side switch element 82, however the gate of the third positive side switch element 100 is simply connected to node A, forcing the third positive side switch element 100 to a continuous off state. In general, leakage currents through a switch element in the off-state are largely controlled by two factors: the size of the switch element, and the drain to source voltage $V_{DS}$ across the switch element. The larger the switch element size, the larger the leakage currents through the switch element. Likewise, the larger the drain to source voltage across the switch element, the larger the leakage currents through the switch element. If the third positive side switch element 100 is of a larger size than the first positive side switch element 74, the leakage currents through third positive side switch element 100 will be larger even at equal $V_{DS}$ voltages. Because the third positive side switch element 100 is connected to the precharge voltage VDD, the voltage at node A will stabilize to a positive voltage, and will not gradually leak to ground potential through the first positive side switch element 74. Similarly, the third negative side switch element 102 is connected in parallel with the second negative side switch element 84. The gate of the third negative side switch element 102 is connected to node B, forcing the third negative side switch element 102 to a continuous off state. If the third negative side switch element 102 is of a larger size than the first negative side switch element 76, the leakage currents through third negative side switch element 102 will be larger even at equal $V_{DS}$ voltages. Because the third negative side switch element 102 is connected to the precharge voltage VDD, the voltage at node B will stabilize to a positive voltage, and will not gradually leak to ground potential through the first negative side switch element 76.

Figure 12:
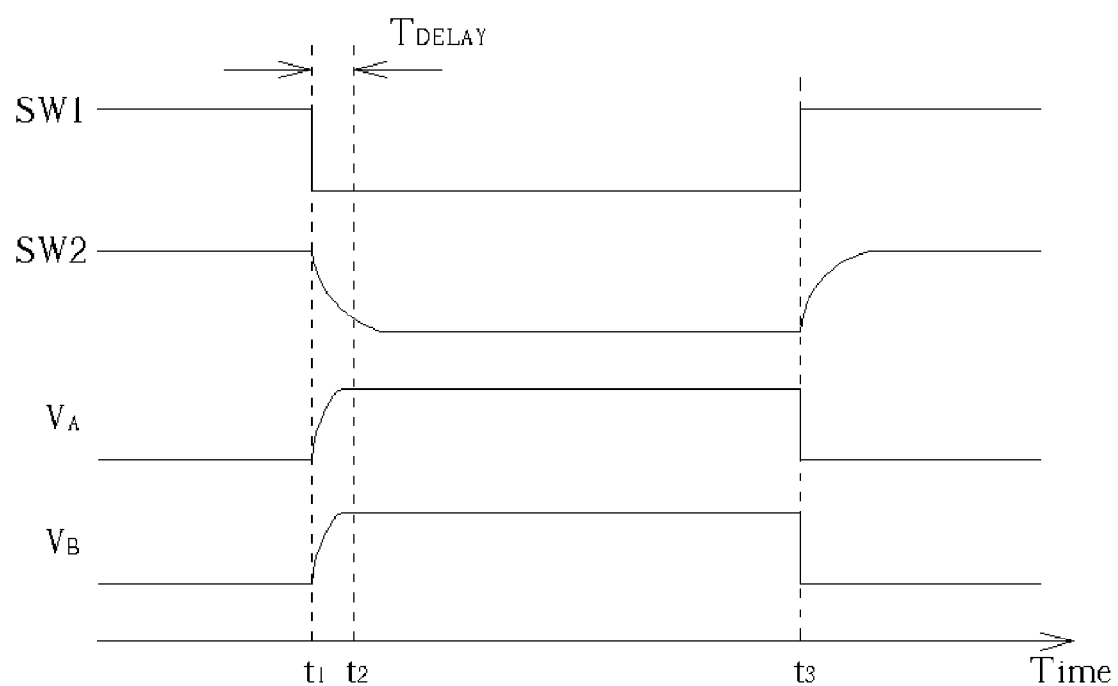
FIG. 12 is a time domain plot of the first control signal, the second control signal, the voltage at node A, and the voltage at node B of FIG. 11.

FIG. 12 shows a time domain plot of the first control signal SW1, the second control signal SW2, the voltage $V_A$ at node A, and the voltage $V_B$ at node B in FIG. 11. The first control signal SW1 and the second control signal SW2 switch off the differential switched capacitor circuit 20f at time t1, similar to the second embodiment shown in FIG. 10. However using the third embodiment shown in FIG. 12, due to the addition of the third positive side switch element 100 and the third negative side switch element 102, there is no gradual drop in the voltage $V_A$ at node A or in the voltage $V_B$ at node B. The third embodiment differential switched capacitor circuit 20f shown in FIG. 11 prevents frequency drift of the VCO due to gradual leakage of node A and node B to ground through the first positive and negative side switch elements 74, 76 in the off-state and is suitable for CDMA based systems.

Figure 13:
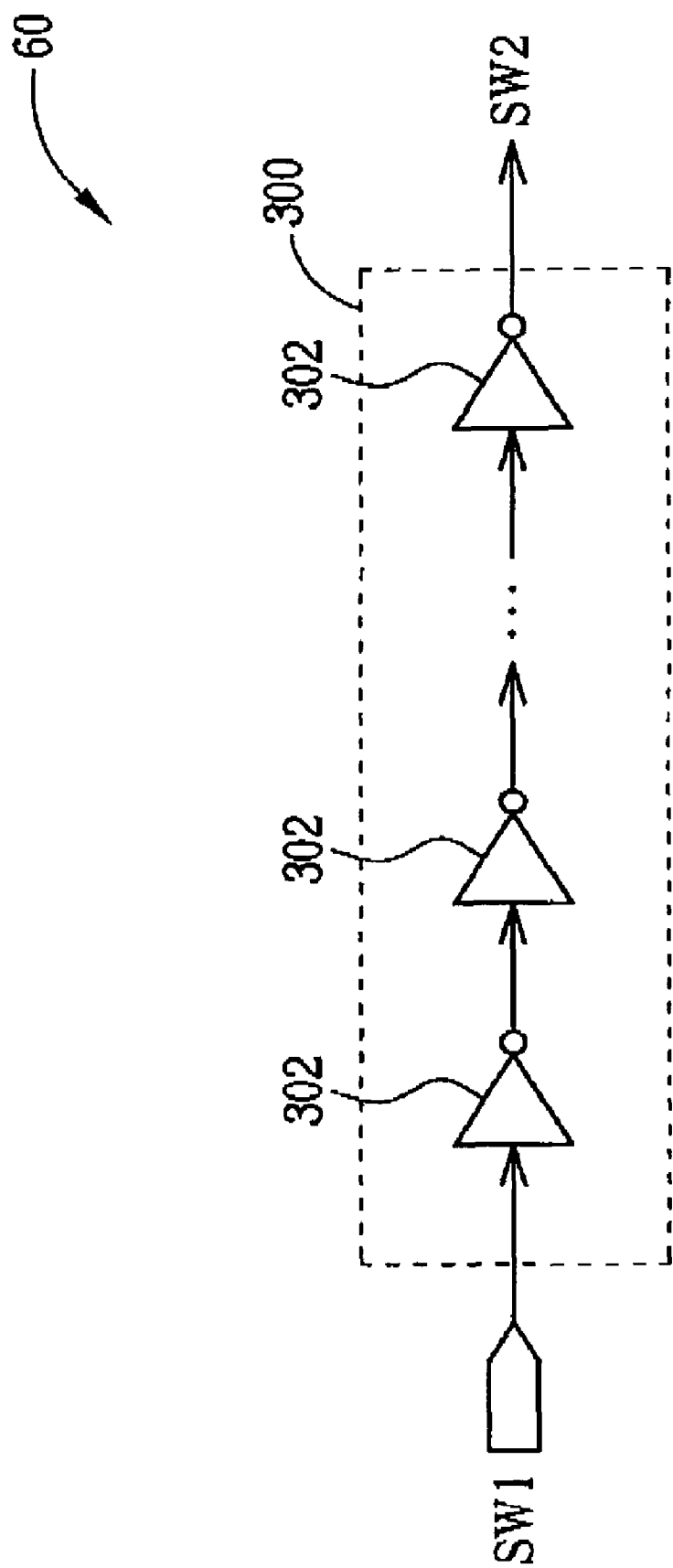
FIG. 13 is a diagram showing a delay unit being fanned by a delay chain of inverters.

It should also be noted that although throughout the detailed description of the present invention CMOS transistors have been used with n-type first positive and negative side switch elements, it is also possible to use bipolar transistors or p-type first positive and negative switch elements. Additionally, the precharge voltage can be changed to voltages other than VDD. For example, if the first positive and Derive side switch elements are implemented with p-type transistors, the precharge switch element should be iplemented as an n-type transistor being connected to a precharge voltage such as ground. Furthermore, the purpose of the delay unit is to delay the first control signal SW1 to produce the second control signal SW2. As shown in FIG. 13, it is also possible to use other delay units 60 such as a delay chain 300 of inverters 302 and a low pass filter connected to the output of the delay chain 300. For differential implementations, the center switch element is an optional component that lowers the overall switch turn-on resistance and could be omitted while still following the teachings of the present invention.

In contrast to the prior art, the present invention switched capacitor circuit precharges node A and node B to a precharge voltage for a limited time when the switched capacitor circuit is switched off. In this way, the clock feedthrough effect is minimized thereby preventing the VCO frequency drift phenomenon during the calibration and the synthesizer phase locking period. Additionally, the capacitance of the varactors formed by the first positive and negative side switch elements in the off-state are stabilized during the VCO locking period. For CDMA based systems, a third positive and negative switch element can be added to prevent a gradual reduction in the voltages at node A and node B due to leakage currents through the first positive and negative side switch elements. Preventing the gradual voltage reductions at node A and node B prevents any frequency drift in a continuously transmitting CDMA system.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A switched capacitor circuit in an oscillator circuit comprising:
   a first positive side switch element for selectively connecting a first positive side node to a second node according to a first control signal, wherein the first positive side node is connected to a positive side capacitor and the positive side capacitor is further connected to an oscillator node in the oscillator circuit; and
   a precharge circuit connected to the first positive side node for precharging the first positive side node to a precharge voltage for a predetermined time when the switched capacitor circuit is switched off;
   wherein the predetermined time is independent of the first control signal.

2. The switched capacitor circuit of claim 1, wherein the precharge circuit comprises:
   a second positive side switch element for selectively connecting a third node to the first positive side node according to a second control signal;
   a precharge switch element for selectively connecting a fourth node to the third node according to the first control signal, the fourth node being at the precharge voltage; and
   a delay unit for generating the second control signal, wherein the second control signal is the first control signal delayed by the predetermined time.

3. The switched capacitor circuit of claim 2, wherein the delay unit comprises a low-pass filter connected to the first control signal, the second control signal being the output of the low-pass filter.

4. The switched capacitor circuit of claim 2, wherein the delay unit comprises a delay chain, the input of the delay chain being the first control signal and the output of the delay chain being the second control signal.

5. The switched capacitor circuit of claim 2, wherein the precharge circuit further comprises:
   a third positive side switch element being connected between the third node and the first positive side node, the control terminal of the third positive side switch element being connected to the first positive side node.

6. The switched capacitor circuit of claim 5, wherein the third positive side switch element is of a larger size than the first and second positive side switch elements.

7. The switched capacitor circuit of claim 2, further comprising:
   a first negative side switch element for selectively connecting a first negative side node to the second node according to the first control signal, the first negative side node being connected to a negative side capacitor, and the first negative side switch element being of substantially the same size as the first positive side switch element;
   wherein the precharge circuit further precharges the first negative side node to the precharge voltage when the switched capacitor circuit is switched off according to the first control signal.

8. The switched capacitor circuit of claim 7, wherein the precharge circuit further comprises:
   a second negative side switch element for selectively connecting the third node to the first negative side node according to the second control signal, the second negative side switch element being of substantially the same size as the second positive side switch element.

9. The switched capacitor circuit of claim 8, further comprising a center switch element for selectively connecting the first positive side node to the first negative side node according to the first control signal.

10. The switched capacitor circuit of claim 8, wherein the precharge circuit further comprises:
    a third positive side switch element being connected between the third node and the first positive side node, the control terminal of the third positive side switch element being connected to the first positive side node; and a third negative side switch element being connected between the third node and the first negative side node, the control terminal of the third negative side switch element being connected to the first negative side node, wherein the third negative side switch element is of substantially the same size as the third positive side switch element.

11. The switched capacitor circuit of claim 10, wherein the third positive and negative side switch elements are of a larger size than the first and second positive and negative side switch elements.

12. The switched capacitor circuit of claim 10, further comprising a center switch element for selectively connecting the first positive side node to the first negative side node according to the first control signal.

13. The switched capacitor circuit of claim 12, wherein the second node is ground, the fourth node is a DC power supply node, the precharge switch element is a p-type transistor, and the first and second positive and negative side switch elements and the center switch element are n-type transistors.

14. The switched capacitor circuit of claim 12, wherein the second node is a DC power supply node, the fourth node is ground, the precharge switch element is an n-type transistor, and the first and second positive and negative side switch elements and the center switch element are p-type transistors.

15. A method for switching off a switched capacitor circuit in an oscillator circuit, the method comprising the following steps:
   (a) disconnecting a first positive side node from a second node according to a first control signal using a first positive side switch element;
   (b) precharging the first positive side node to a precharge voltage for a predetermined time when the switched capacitor circuit is switched off; and
   providing a positive side capacitor being connected to the first positive side node, the positive side capacitor being further connected to an oscillator node in the oscillator circuit;
   wherein the predetermined time is independent of the first control signal.

16. The method of claim 15, wherein step (b) comprises the following steps:
   (c) connecting a fourth node to a third node according to the first control signal using a precharge switch element, the fourth node being at the precharge voltage;
   (d) delaying the first control signal by the predetermined time to create a second control signal; and
   (e) connecting the third node to the first positive side node according to the second control signal using a second positive side switch element.

17. The method of claim 16, wherein step (d) comprises low-pass filtering the first control signal.

18. The method of claim 16, wherein step (d) comprises inputting the first control signal into a delay chain, the output of the delay chain being the second control signal.

19. The method of claim 16, wherein step (b) further comprises:
   providing a third positive side switch element being connected between the third node and the first positive side node, the control terminal of the third positive side switch element being connected to the first positive side node.

20. The method of claim 19, wherein the third positive side switch element is of a larger size than the first and second positive side switch elements.

21. The method of claim 16, wherein step (b) further comprises:
   connecting a first negative side node to the second node using a first negative side switch element according to the first control signal, the first negative side node being connected to a negative side capacitor, and the first negative side switch element being of substantially the same size as the first positive side switch element;
   wherein step (b) further comprises precharging the first negative side node to the precharge voltage when the switched capacitor circuit is switched off according to the first control signal.

22. The method of claim 21, wherein step (b) further comprises:
   connecting the third node to the first negative side node using a second negative side switch element according to the second control signal, the second negative side switch element being of substantially the same size as the second positive side switch element.

23. The method of claim 21, further comprising connecting the first positive side node to the first negative side node according to the first control signal using a center switch element.

24. The method of claim 21, wherein step (b) further comprises:
   providing a third positive side switch element being connected between the third node and the first positive side node, the control terminal of the third positive side switch element being connected to the first positive side node; and
   providing a third negative side switch element being connected between the third node and the first negative side node, the control terminal of the third negative side switch element being connected to the first negative side node, wherein the third negative side switch element is of substantially the same size as the third positive side switch element.

25. The method of claim 24 wherein the third positive and negative side switch elements are of a larger size than the first and second positive and negative side switch elements.

26. The method of claim 24 further comprising connecting the first positive side node to the first negative side node according to the first control signal using a center switch element.

27. The method of claim 26 wherein the second node is ground, the fourth node is a DC power supply node, the precharge switch element is a p-type transistor, and the first and second positive and negative side switch elements and the center switch element are n-type transistors.

28. The method of claim 26, wherein the second node is a DC power supply node, the fourth node is ground, the precharge switch element is an n-type transistor, and the first and second positive and negative side switch elements and the center switch element are p-type transistors.

* * * * *